US 9,234,916 B2

(12) United States Patent
Peck et al.

(10) Patent No.: US 9,234,916 B2
(45) Date of Patent: Jan. 12, 2016

(54) STATUS MONITORING CABLES FOR GENERATORS

(71) Applicant: Alpha Technologies, Inc., Bellingham, WA (US)

(72) Inventors: Tobias M. Peck, Bellingham, WA (US); Jonathan D. Carpenter, Bellingham, WA (US); Donald L. Thompson, Bellingham, WA (US); Mike L. Foster, Bellingham, WA (US)

(73) Assignee: Alpha Technologies Inc., Bellingham, WA (US)

( * ) Notice: Subject to any disclaimer, the term of this patent is extended or adjusted under 35 U.S.C. 154(b) by 434 days.

(21) Appl. No.: 13/831,037

(22) Filed: Mar. 14, 2013

(65) Prior Publication Data

US 2014/0028288 A1      Jan. 30, 2014

Related U.S. Application Data

(60) Provisional application No. 61/646,140, filed on May 11, 2012.

(51) Int. Cl.
*G01R 1/20* (2006.01)
*G01R 19/145* (2006.01)
(Continued)

(52) U.S. Cl.
CPC ............... *G01R 1/20* (2013.01); *G01R 1/0416* (2013.01); *G01R 19/145* (2013.01); *H02J 9/061* (2013.01);
(Continued)

(58) Field of Classification Search
CPC .............. G01R 19/145; H02J 13/0062; H01R 13/7031; Y02B 70/3291
USPC ............. 324/126; 361/679.01, 600–601, 641, 361/668, 639, 648; 439/512–513, 600–675; 307/64–66, 85–87; 323/258–259; 702/63, 183; 369/679.01
See application file for complete search history.

(56) References Cited

U.S. PATENT DOCUMENTS 352,105   A   11/1886   Zipernowsky et al.
375,614   A   12/1887   Eickemeyer
(Continued)

FOREIGN PATENT DOCUMENTS

AU   2029495   12/1995
CA   1265231   1/1990
(Continued)

OTHER PUBLICATIONS

Batson et al., Solving the Powering Requirements of Broadband Dial Tone Service, 1994, 3 pages.
(Continued)

*Primary Examiner* — Patrick Assouad
*Assistant Examiner* — Khristopher Yodichkas
(74) *Attorney, Agent, or Firm* — Michael R. Schacht; Schacht Law Ofice, Inc

(57) ABSTRACT

A connector system comprising a status monitoring cable system comprising a first cable connector adapted to be connected to a generator connector, a second cable connector adapted to be connected to a UPS connector, a third cable connector adapted to be connected to the modem connector, a jumper, first and second power conductors connected between the first cable connector and the second cable connector, and a sensor module comprising a current detect module and a connector detect module. The current detect module transmits a GEN_ON signal to the modem when a current is present in at least one of the first and second power conductors. The connector detect module transmits a GEN_PRESENT signal to the modem when a current flows through the first cable connector, the generator connector, the jumper, the generator connector, and the first cable connector.

21 Claims, 9 Drawing Sheets

(51) Int. Cl.
  *G01R 1/04* (2006.01)
  *H02J 9/06* (2006.01)
  *H02J 13/00* (2006.01)
  *H01R 13/703* (2006.01)

(52) U.S. Cl.
  CPC ......... *H02J 13/0062* (2013.01); *H01R 13/7031* (2013.01); *Y02B 70/3291* (2013.01); *Y02B 90/222* (2013.01); *Y02B 90/226* (2013.01); *Y04S 20/12* (2013.01); *Y04S 20/16* (2013.01); *Y04S 20/248* (2013.01)

(56) References Cited

U.S. PATENT DOCUMENTS

| | | |
|---|---|---|
| 414,266 A | 11/1889 | Thomson |
| 1,718,238 A | 6/1929 | Kettering et al. |
| 1,950,396 A | 3/1934 | Boucher |
| 2,007,415 A | 7/1935 | Walker |
| 2,014,101 A | 9/1935 | Bryan |
| 2,037,183 A | 4/1936 | Strieby |
| 2,036,994 A | 12/1936 | Frank et al. |
| 2,085,072 A | 6/1937 | Bobe |
| 2,165,969 A | 7/1939 | Humbert et al. |
| 2,240,123 A | 4/1941 | Shoup et al. |
| 2,302,192 A | 11/1942 | Dannheiser |
| 2,352,073 A | 6/1944 | Boucher et al. |
| 2,427,678 A | 9/1947 | Laging |
| 2,444,794 A | 7/1948 | Uttal et al. |
| 2,512,976 A | 6/1950 | Smeltzly |
| 2,688,704 A | 9/1954 | Christenson |
| 2,856,543 A | 10/1958 | Dixon et al. |
| 2,920,211 A | 1/1960 | Gotoh |
| 2,996,656 A | 8/1961 | Sola |
| 3,022,458 A | 2/1962 | Sola |
| 3,064,195 A | 11/1962 | Freen |
| 3,221,172 A | 11/1965 | Rolison |
| 3,283,165 A | 11/1966 | Bloch |
| 3,293,445 A | 12/1966 | Levy |
| 3,304,599 A | 2/1967 | Nordin |
| 3,305,762 A | 2/1967 | Geib, Jr. |
| 3,339,080 A | 8/1967 | Howald |
| 3,345,517 A | 10/1967 | Smith |
| 3,348,060 A | 10/1967 | Jamieson |
| 3,389,329 A | 6/1968 | Quirk et al. |
| 3,435,358 A | 3/1969 | Rheinfelder |
| 3,458,710 A | 7/1969 | Dodge |
| 3,521,152 A | 7/1970 | Emerson |
| 3,525,035 A | 8/1970 | Kakalec |
| 3,525,078 A | 8/1970 | Baggott |
| 3,546,571 A | 12/1970 | Fletcher et al. |
| 3,590,362 A | 6/1971 | Kakalec |
| 3,636,368 A | 1/1972 | Sia |
| 3,678,284 A | 7/1972 | Peters |
| 3,678,377 A | 7/1972 | Chiffert |
| 3,686,561 A | 8/1972 | Spreadbury |
| 3,691,393 A | 9/1972 | Papachristou |
| 3,737,858 A | 6/1973 | Turner et al. |
| 3,742,251 A | 6/1973 | Thompson et al. |
| 3,823,358 A | 7/1974 | Rey |
| 2,860,748 A | 1/1975 | Everhart et al. |
| 3,859,589 A | 1/1975 | Rush |
| 3,873,846 A | 3/1975 | Morio et al. |
| 3,909,560 A | 9/1975 | Martin et al. |
| 3,916,295 A | 10/1975 | Hunter |
| 3,938,033 A | 2/1976 | Borkovitz et al. |
| 3,943,447 A | 3/1976 | Shomo, III |
| 4,004,110 A | 1/1977 | Whyte |
| 4,010,381 A | 3/1977 | Fickenscher et al. |
| 4,060,844 A | 11/1977 | Davis et al. |
| 4,122,382 A | 10/1978 | Bernstein |
| 4,130,790 A | 12/1978 | Heisey |
| 4,170,761 A | 10/1979 | Koppehele |
| 4,198,624 A | 4/1980 | Watanabe |
| 4,217,533 A | 8/1980 | Van Beek |
| 4,251,736 A | 2/1981 | Coleman |
| 4,262,245 A | 4/1981 | Wendt |
| 4,270,080 A | 5/1981 | Kostecki |
| 4,277,692 A | 7/1981 | Small |
| 4,295,053 A | 10/1981 | Kovatch et al. |
| 4,295,054 A | 10/1981 | Kovatch et al. |
| 4,313,060 A | 1/1982 | Fickenscher et al. |
| 4,353,014 A | 10/1982 | Willis |
| 4,366,389 A | 12/1982 | Hussey |
| 4,366,390 A | 12/1982 | Rathmann |
| 4,385,263 A | 5/1983 | Luz et al. |
| 4,400,624 A | 8/1983 | Ebert, Jr. |
| 4,400,625 A | 8/1983 | Hussey |
| 4,423,379 A | 12/1983 | Jacobs et al. |
| 4,446,458 A | 5/1984 | Cook |
| 4,460,834 A | 7/1984 | Gottfried |
| 4,466,041 A | 8/1984 | Witulski et al. |
| 4,472,641 A | 9/1984 | Dickey et al. |
| 4,475,047 A | 10/1984 | Ebert, Jr. |
| 4,477,799 A | 10/1984 | Rocci et al. |
| 4,510,401 A | 4/1985 | Legoult |
| 4,604,530 A | 8/1986 | Shibuya |
| 4,616,305 A | 10/1986 | Damiano et al. |
| 4,628,426 A | 12/1986 | Steigerwald |
| 4,631,471 A | 12/1986 | Fouad et al. |
| 4,656,412 A | 4/1987 | McLyman |
| 4,670,702 A | 6/1987 | Yamada et al. |
| 4,673,825 A | 6/1987 | Raddi et al. |
| 4,686,375 A | 8/1987 | Gottfried |
| 4,697,134 A | 9/1987 | Burkum et al. |
| 4,700,122 A | 10/1987 | Cimino et al. |
| 4,709,318 A | 11/1987 | Gephart et al. |
| 4,719,427 A | 1/1988 | Morishita et al. |
| 4,719,550 A | 1/1988 | Powell et al. |
| 4,724,290 A | 2/1988 | Campbell |
| 4,724,478 A | 2/1988 | Masuko et al. |
| 4,730,242 A | 3/1988 | Divan |
| 4,733,223 A | 3/1988 | Gilbert |
| 4,740,739 A | 4/1988 | Quammen et al. |
| 4,745,299 A | 5/1988 | Eng et al. |
| 4,748,341 A | 5/1988 | Gupta |
| 4,748,342 A | 5/1988 | Dijkmans |
| 4,763,014 A | 8/1988 | Model et al. |
| 4,775,800 A | 10/1988 | Wood |
| 4,791,542 A | 12/1988 | Piaskowski |
| 4,829,225 A | 5/1989 | Podrazhansky et al. |
| 4,860,185 A | 8/1989 | Brewer et al. |
| 4,864,483 A | 9/1989 | Divan |
| 4,882,717 A | 11/1989 | Hayakawa et al. |
| 4,885,474 A * | 12/1989 | Johnstone .............. H02J 9/02 307/150 |
| 4,890,213 A | 12/1989 | Seki |
| 4,916,329 A | 4/1990 | Dang et al. |
| 4,920,475 A | 4/1990 | Rippel |
| 4,922,125 A * | 5/1990 | Casanova ............. H05K 7/1449 307/147 |
| 4,926,084 A | 5/1990 | Furutsu et al. |
| 4,943,763 A | 7/1990 | Bobry |
| 4,952,834 A | 8/1990 | Okada |
| 4,954,741 A | 9/1990 | Furutsu et al. |
| 4,975,649 A | 12/1990 | Bobry |
| 4,988,283 A | 1/1991 | Nagasawa et al. |
| 5,010,469 A | 4/1991 | Bobry |
| 5,017,800 A | 5/1991 | Divan |
| 5,027,264 A | 6/1991 | DeDoncker et al. |
| 5,029,285 A | 7/1991 | Bobry |
| 5,057,698 A | 10/1991 | Widener et al. |
| 5,099,410 A | 3/1992 | Divan |
| 5,137,020 A | 8/1992 | Wayne et al. |
| 5,148,043 A | 9/1992 | Hirata et al. |
| 5,154,986 A | 10/1992 | Takechi et al. |
| 5,168,205 A | 12/1992 | Kan et al. |
| 5,172,009 A | 12/1992 | Mohan |
| 5,185,536 A | 2/1993 | Johnson, Jr. et al. |
| 5,193,067 A | 3/1993 | Sato et al. |
| 5,198,698 A | 3/1993 | Paul et al. |
| 5,198,970 A | 3/1993 | Kawabata et al. |
| 5,200,586 A | 4/1993 | Smith et al. |
| 5,200,643 A | 4/1993 | Brown |

(56) References Cited

U.S. PATENT DOCUMENTS

| | | |
|---|---|---|
| 5,220,597 A | 6/1993 | Horiuchi |
| 5,224,025 A | 6/1993 | Divan et al. |
| 5,229,650 A | 7/1993 | Kita et al. |
| 5,237,208 A | 8/1993 | Tominaga et al. |
| 5,241,591 A | 8/1993 | Saji |
| 5,281,919 A | 1/1994 | Palanisamy |
| 5,302,858 A | 4/1994 | Folts |
| 5,400,005 A | 3/1995 | Bobry |
| 5,402,053 A | 3/1995 | Divan et al. |
| 5,410,720 A | 4/1995 | Osterman |
| 5,440,179 A | 8/1995 | Severinsky |
| 5,457,377 A | 10/1995 | Jonsson |
| 5,467,384 A | 11/1995 | Skinner, Sr. |
| 5,483,463 A | 1/1996 | Qin et al. |
| 5,532,525 A | 7/1996 | Kaiser et al. |
| 5,579,197 A | 11/1996 | Mengelt et al. |
| 5,581,246 A | 12/1996 | Yarberry et al. |
| 5,602,462 A | 2/1997 | Stich et al. |
| 5,610,451 A | 3/1997 | Symonds |
| 5,635,773 A | 6/1997 | Stuart |
| 5,638,244 A | 6/1997 | Mekanik et al. |
| 5,642,002 A | 6/1997 | Mekanik et al. |
| 5,664,002 A | 9/1997 | Skinner, Sr. |
| 5,734,831 A | 3/1998 | Sanders |
| 5,739,595 A | 4/1998 | Mekanik et al. |
| 5,745,356 A | 4/1998 | Tassitino, Jr. et al. |
| 5,747,887 A | 5/1998 | Takanaga et al. |
| 5,747,888 A | 5/1998 | Zilberberg |
| 5,760,495 A | 6/1998 | Mekanik |
| 5,768,117 A | 6/1998 | Takahashi et al. |
| 5,783,932 A | 7/1998 | Namba et al. |
| 5,790,391 A | 8/1998 | Stich et al. |
| 5,844,327 A | 12/1998 | Batson |
| 5,880,536 A | 3/1999 | Mardirossian |
| 5,892,431 A | 4/1999 | Osterman |
| 5,897,766 A | 4/1999 | Kawatsu |
| 5,901,057 A | 5/1999 | Brand et al. |
| 5,925,476 A | 7/1999 | Kawatsu |
| 5,961,604 A | 10/1999 | Anderson et al. |
| 5,982,645 A | 11/1999 | Levran et al. |
| 5,982,652 A | 11/1999 | Simonelli et al. |
| 5,994,793 A | 11/1999 | Bobry |
| 5,994,794 A | 11/1999 | Wehrlen |
| 6,011,324 A | 1/2000 | Kohlstruck et al. |
| 6,014,015 A | 1/2000 | Thorne et al. |
| 6,028,414 A | 2/2000 | Chouinard et al. |
| 6,069,412 A | 5/2000 | Raddi et al. |
| 6,100,665 A | 8/2000 | Alderman |
| 6,198,178 B1 | 3/2001 | Schienbein et al. |
| 6,212,081 B1 | 4/2001 | Sakai |
| 6,218,744 B1 | 4/2001 | Zahrte, Sr. et al. |
| 6,288,456 B1 | 9/2001 | Cratty |
| 6,288,916 B1 | 9/2001 | Liu et al. |
| 6,295,215 B1 | 9/2001 | Faria et al. |
| 6,348,782 B1 | 2/2002 | Oughton, Jr. et al. |
| 6,456,036 B1 | 9/2002 | Thandiwe |
| 6,465,910 B2 | 10/2002 | Young et al. |
| 6,486,399 B1 | 11/2002 | Armstrong et al. |
| 6,602,627 B2 | 8/2003 | Liu et al. |
| 6,768,722 B1 | 7/2004 | Katseff et al. |
| 6,841,971 B1 | 1/2005 | Spee et al. |
| 6,906,933 B2 | 6/2005 | Taimela |
| 6,933,626 B2 | 8/2005 | Oughton, Jr. |
| 7,040,920 B2 | 5/2006 | Johnson, Jr. et al. |
| 7,182,632 B1 | 2/2007 | Johnson, Jr. et al. |
| 7,449,798 B2 | 11/2008 | Suzuki et al. |
| 7,543,328 B2 | 6/2009 | Bialk et al. |
| 7,835,379 B2 | 11/2010 | Dravida et al. |
| 8,074,888 B2 | 12/2011 | Naccache |
| 8,344,685 B2 | 1/2013 | Bertness et al. |
| 8,575,779 B2 | 11/2013 | Le et al. |
| 8,616,457 B2 | 12/2013 | Krawczewicz et al. |
| 2005/0096772 A1 | 5/2005 | Cox et al. |
| 2005/0258927 A1 | 11/2005 | Lu |
| 2007/0262650 A1 | 11/2007 | Li |
| 2008/0024268 A1 | 1/2008 | Wong et al. |
| 2008/0278006 A1 | 11/2008 | Gottlieb et al. |
| 2009/0076661 A1* | 3/2009 | Pearson ............ H01M 8/04619 700/291 |
| 2009/0196082 A1 | 8/2009 | Mazumder et al. |
| 2009/0240377 A1* | 9/2009 | Batzler ............... G05B 23/0216 700/287 |
| 2010/0161259 A1 | 6/2010 | Kim et al. |
| 2010/0250192 A1 | 9/2010 | Deokar et al. |
| 2010/0324548 A1* | 12/2010 | Godara ............... A61B 18/1492 606/34 |
| 2010/0328851 A1 | 12/2010 | Jurek |
| 2011/0238345 A1* | 9/2011 | Gauthier ............... G01R 31/002 702/64 |
| 2012/0091811 A1 | 4/2012 | Heidenreich et al. |
| 2012/0212051 A1 | 8/2012 | Heidenreich et al. |
| 2012/0217800 A1 | 8/2012 | Heidenreich et al. |
| 2012/0217806 A1 | 8/2012 | Heidenreich et al. |
| 2012/0217808 A1 | 8/2012 | Richardson et al. |

FOREIGN PATENT DOCUMENTS

| | | |
|---|---|---|
| CA | 2033685 | 10/1991 |
| CA | 2036296 | 11/1991 |
| CA | 1297546 | 3/1992 |
| CA | 2086897 | 7/1993 |
| CA | 2028269 | 1/2000 |
| CA | 2149845 | 2/2000 |
| CA | 2403888 | 9/2002 |
| CA | 2168520 | 8/2003 |
| CA | 2504101 | 6/2005 |
| CA | 2713017 | 7/2009 |
| CA | 2760581 | 11/2010 |
| CN | 101330686 B | 3/2012 |
| DE | 2602789 | 7/1977 |
| DE | 2809514 | 9/1978 |
| DE | 3321649 | 12/1983 |
| EP | 0284541 | 9/1988 |
| EP | 2425515 | 3/2012 |
| FR | 762789 | 4/1934 |
| FR | 861215 | 2/1941 |
| GB | 005201 | 4/1885 |
| GB | 260731 | 9/1925 |
| GB | 2005118 | 4/1979 |
| GB | 2120474 | 11/1983 |
| GB | 2137033 | 3/1984 |
| GB | 2171861 | 9/1986 |
| GB | 2185326 | 10/1986 |
| GB | 2355350 | 4/2001 |
| GB | 2475612 A | 5/2011 |
| JP | 5482053 | 6/1979 |
| JP | 55032133 | 3/1980 |
| JP | 5650417 | 5/1981 |
| JP | 56155420 | 12/1981 |
| JP | 2000350381 | 12/2000 |
| JP | 2001190035 | 7/2001 |
| JP | 2005295776 | 10/2005 |
| JP | 2010136547 | 6/2010 |
| JP | 2010252573 | 11/2010 |
| KR | 20070108759 | 11/2007 |
| RU | 2191459 | 10/2002 |
| RU | 2221320 | 10/2004 |
| TW | 200941897 A | 10/2009 |
| WO | 8501842 | 4/1985 |
| WO | 2009094540 | 7/2009 |
| WO | 2011103131 | 8/2011 |
| WO | 2012099911 | 7/2012 |
| WO | 2012112252 | 8/2012 |
| WO | 2012148512 | 11/2012 |

OTHER PUBLICATIONS

Contino et al., Water-Cooling Applications for Telecommunications and Computer Energy Systems, Telecommunications Energy Conference, IEEE, 1988, pp. 441-447.

Eto et al., Research, Development, and Demonstration Needs for Large-Scale, Reliability-Enhancing, Integration of Distributed Energy Resources, IEEE Proceedings of the 33rd Hawaii International Conference on System Sciences, 2000, 7 pages.

(56) References Cited

OTHER PUBLICATIONS

Jain et al., High Frequency Triport UPS Topologies for Emerging Fiber Networks, Telecommunications Energy Conference, IEEE, 1998, pp. 505-512.
Rando, AC Tripod—A New Uninterruptible AC Power Supply, Telephone Energy Conference, IEEE, 1978, pp. 50-58.
Wallace et al., Wireless Load Sharing of Single Phase Telecom Inverters, Telecommunication Energy Conference, 1999, 13 pages.
Yamada, Research and Development of Telecommunications Energy Systems in NTT, NTT Integrated Infromation and Energy Systems Laboratories, Mar. 9, 2011, 8 pages.
Smart Powershop/Smart Energy Systems International AG, "Off-Grid SMA Power Set XS," Sep. 29, 2010, 5 pages.
Bridge et al., "Preventing outages without batteries", CED, Jun. 1999, 7 pages.
Broadband Business and News Perspective, "Cable operators feeling power surge", Reprinted from CED, Apr. 2000, 4 pages.
H.C. Gerdes et al., A Practical Approach to Understanding Ferroresonance, EEE-Circuit Design Engineering, pp. 87-89, Apr. 1966.
Hart et al., The Derivation and Application of Design Equations for Ferroresonant Voltage Regulators and Regulated Rectifiers, IEEE Transactions on Magnetics, vol. MAG-7, No. 1, Mar. 1971, pp. 205-211.
IEEE Standard for Ferroresonant Voltage Regulators, Electronics Transformer Technical Committee of the IEEE Power Electronics Society, IEEE Std. 449-1990, May 16, 1990, 29 pages.
Ivensys, "Power When You Really Need It!", Publication No. CSG29FXA, Feb. 2000, 2 pages.
Ivensys, "Sometimes Less Is More!", Publication No. CSG28FXA, Feb. 2000, 2 pages.
Jefferson T. Mitchell et al., Rectifiers and Energy Conservation, Telecommunications, Mar. 1979, 3 pages.
Kakalec et al., New Technology for Battery-Charging Rectifiers, Bell Laboratories Record, May 1979, pp. 131-134.
Lectro Products Incorporated, "Solving CATV Power Solutions", Publication No. CSG24FYA, Jun. 1999, 12 pages.
Lectro Products Incorporated, "Lectro Ferro Family", Publication No. CSG16FXA, Nov. 1998, 4 pages.
Marcotte, "Power migration strategies for future-proofing", Reprinted from CED Magazine, Jun. 1997, 4 pages.
Marcotte et al., "Powering Cable TV Systems", Reprinted from Broadband Systems & Design, Jun. 1996, 4 pages.
McGraw-Hill, Dictionary of Scientific and Technical Terms Fifth Edition, p. 745 and pp. 1696-1697, 1994.
Multipower, Inc., "Confluence Newsletters, vols. I and II", "MP 900", "MP1350", web site http://www.multipowerups.com/index.htm, Aug. 2000, 16 pages.
Nowak, Power Problems: Selecting a UPS, Electronics Test, Jul. 13, 1990, 4 pages, No. 7, San Francisco, CA, US.
Spears, "Disturbances Can Toast Your System", Reprint from Communications Technology, Apr. 2000, 4 pages.
Rex Teets, Application and Design of Ferroresonant Transformers, No Date, pp. 28-34.
Xia, Ordinary Meter Measures Battery Resistance, EDN—Design Ideas, Jun. 24, 1993, 2 pages.
International Searching Authority, "PCT/US2011/025000", International Search Report, Oct. 26, 2011, 9 pages.
International Searching Authority, "PCT/US2012/021619", International Search Report, May 17, 2012, 7 pages.
International Search Report, PCT/US99/19677, Feb. 8, 2000, 5 pages.
Kakalec, "A Feedback-Controlled Ferroresonant Voltage Regulator," IEEE Transactions of Magnetics, Mar. 1970, 5 pages, vol. Mag-6, No. 1.

\* cited by examiner

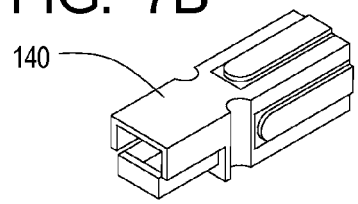
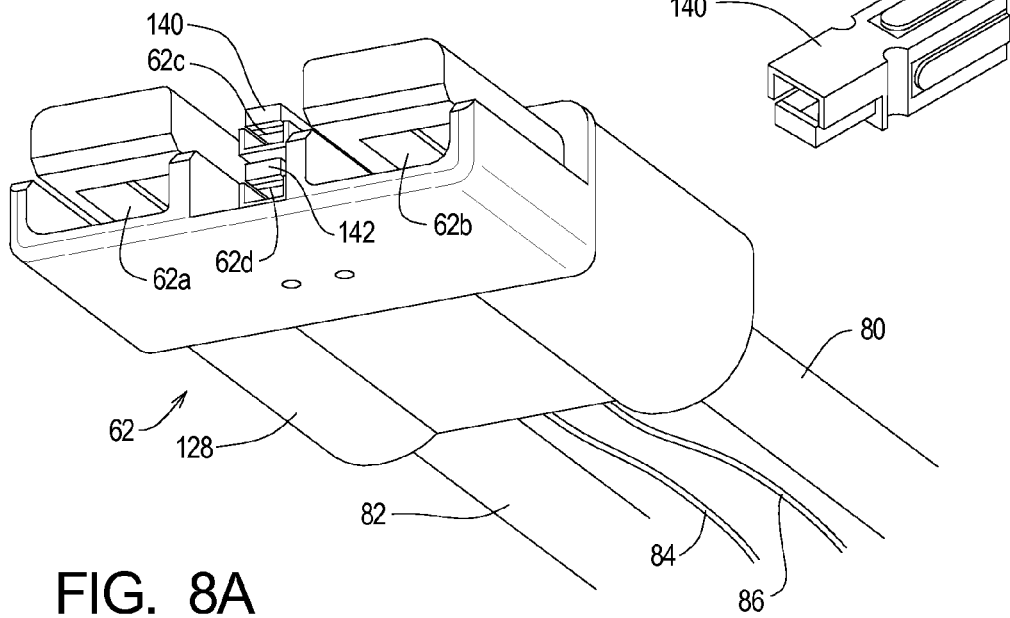
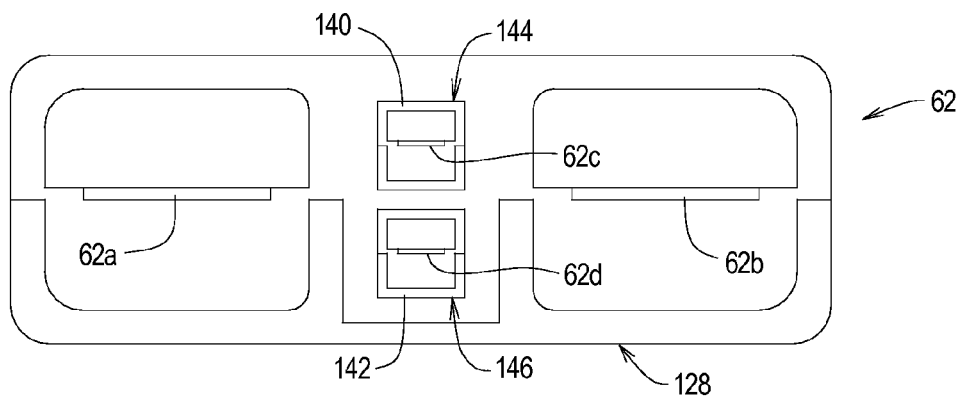
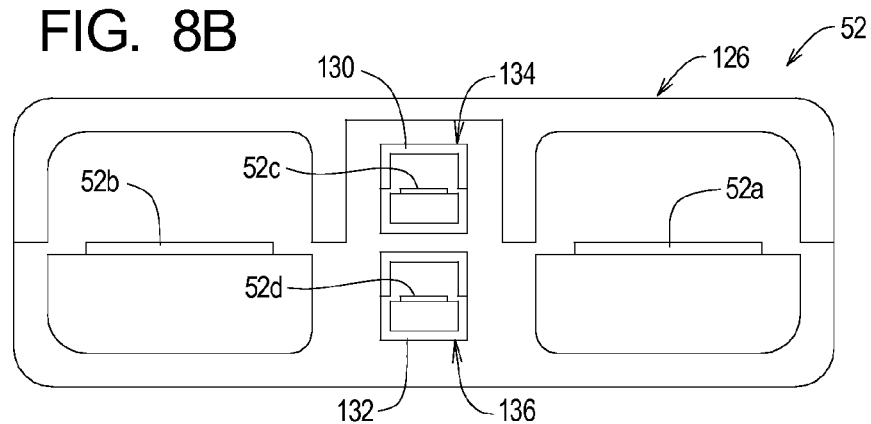

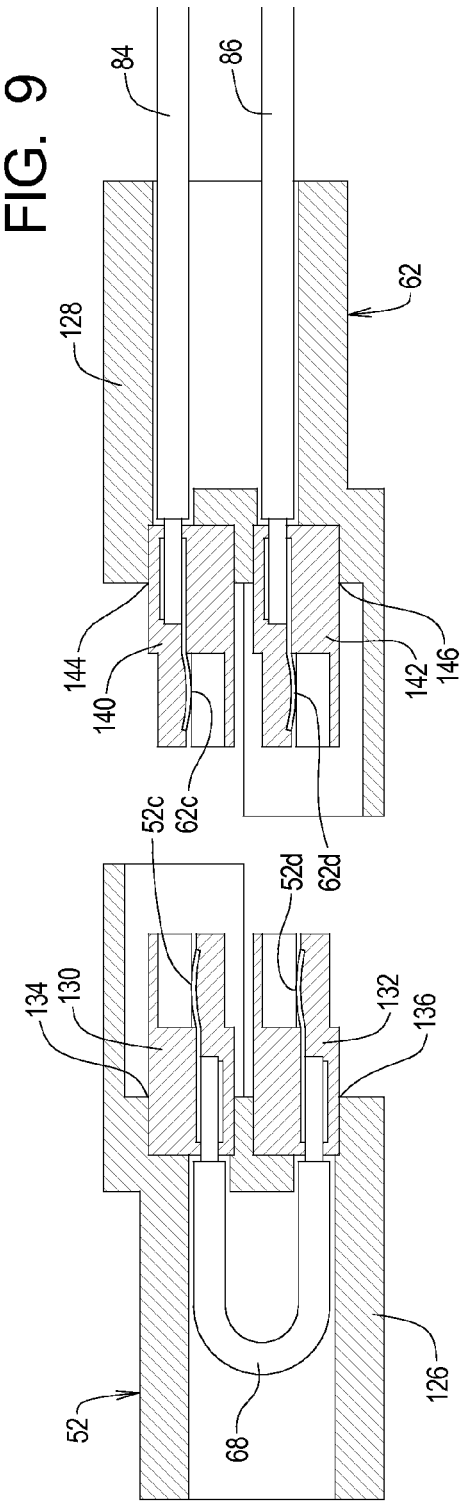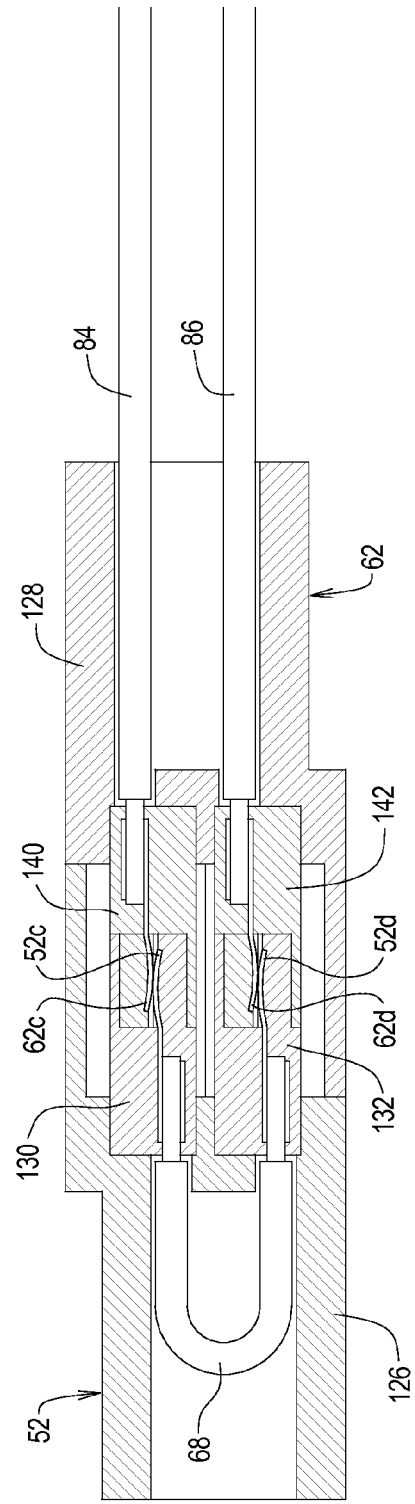

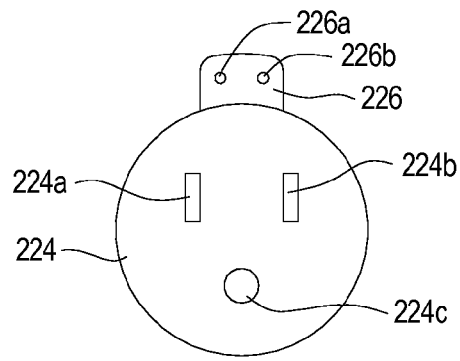
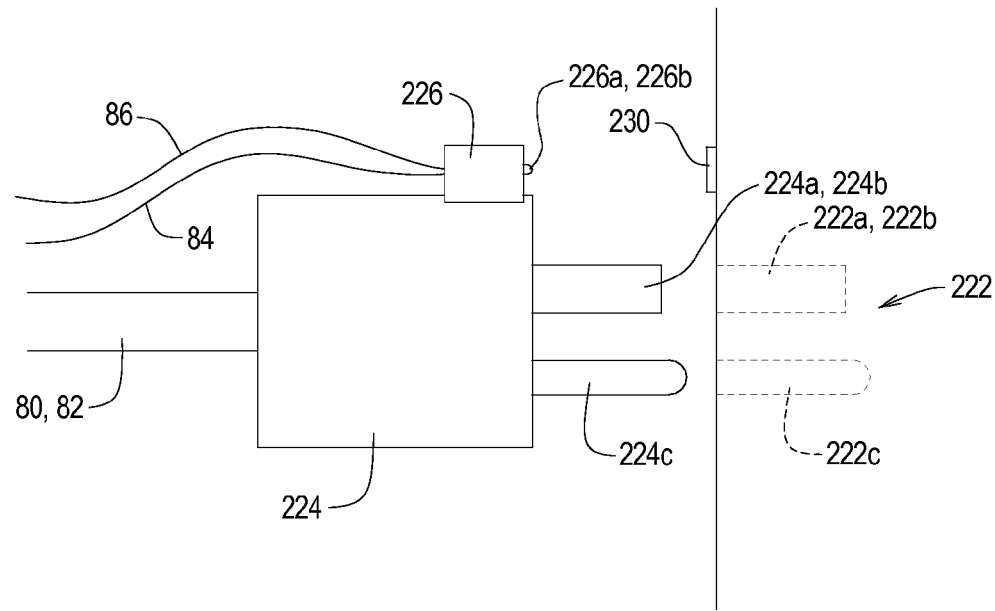
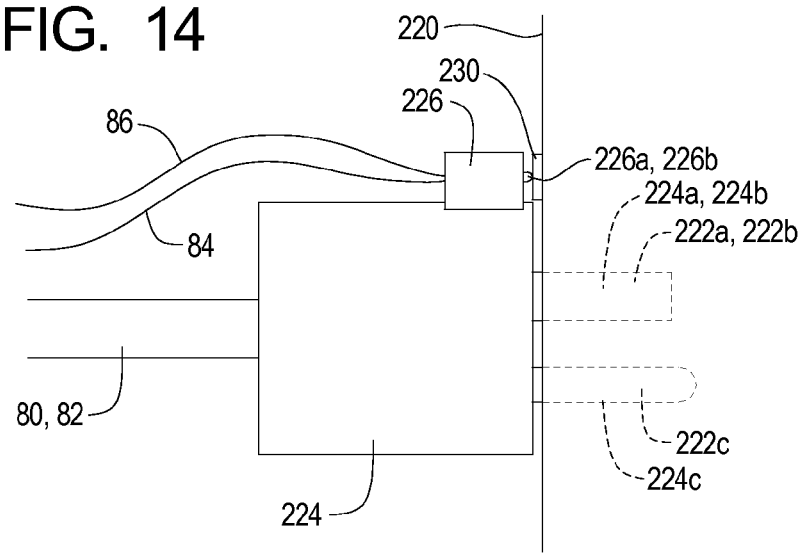

STATUS MONITORING CABLES FOR GENERATORS

RELATED APPLICATIONS

This application claims benefit of U.S. Provisional Application Ser. No. 61/646,140, filed May 11, 2012, the contents of which are incorporated herein by reference.

TECHNICAL FIELD

The present invention relates to the systems and methods for providing power to telecommunication loads and, more particularly, for cable systems and methods that allow the status of a generator to be monitored remotely.

BACKGROUND

The present invention is of particular significance in the context of generators used to supply power to electrical components located at remote locations, and that application of the present invention will be discussed in detail below. However, the principles of the present invention may be applied to other types of power supplies used in a communications system and to generators used to provide power to electrical components of systems other than communications systems.

Distributed communications systems typically comprise electrical components distributed at remote locations in a wide geographical area. Electrical power to electrical components located at such remote locations may be obtained from any one or more of a number of sources depending upon what is available at a particular remote location. In many remote locations, utility power is available for use as at least a primary source of electrical power. In other remote locations, primary power may be provided by wind power systems, solar power systems, and/or generators. Even when not used to supply primary power, generators are often used to provide at least standby power to components located at remote locations, typically as part of an uninterruptible power supply (UPS) also including a battery power system.

When generators are used to provide primary or standby power to communications systems components located at remote locations, it is desirable for the communications system to determine the operational status of such generators. However, generators are typically sourced from a variety of different manufacturers, and it may not be practical for the communications system to interface directly with the generator control system for each brand of generator on the market.

The need thus exists for status monitoring systems for power sources, such as generators, that are independent of the particulars of a given generator, may be retrofitted to existing generators, are easy to install, and are reliable.

SUMMARY

The present invention may be embodied as a connector system adapted to be connected to a generator, a UPS system, and a modem. The connector system comprises a generator connector operatively connected to the generator, a UPS connector operatively connected to the UPS system, a modem connector operatively connected to the modem; a status monitoring cable system comprising a first cable connector adapted to be connected to the generator connector, a second cable connector adapted to be connected to the UPS connector, a third cable connector adapted to be connected to the modem connector, a jumper, first and second power conductors connected between the first cable connector and the second cable connector, and a sensor module. The sensor module comprises a current detect module and a connector detect module. The current detect module is coupled to at least one of the first and second power conductors and operatively connected to the third cable connector. The connector detect module is operatively connected to the first cable connector and the third cable connector. The jumper is supported relative to the generator connector. The current detect module transmits a GEN_ON signal to the modem when a current is present in at least one of the first and second power conductors. The connector detect module transmits a GEN_PRESENT signal to the modem when a current flows through the first cable connector, the generator connector, the jumper, the generator connector, and the first cable connector.

The present invention may also be embodied as a method of connecting a generator, a UPS system, and a modem comprising the following steps. A generator connector is operatively connected to the generator. A UPS connector is operatively connected to the UPS system. A modem connector is operatively connected to the modem. A first cable connector adapted to be connected to the generator connector is provided. A second cable connector adapted to be connected to the UPS connector is provided. A third cable connector adapted to be connected to the modem connector is provided. First and second power conductors are connected between the first cable connector and the second cable connector. A current detect module is coupled to at least one of the first and second power conductors. The current detect module is operatively connected to the third cable connector. A connector detect module is operatively connected to the first cable connector and the third cable connector. The jumper is supported relative to the generator connector. The current detect module is caused to transmit a GEN_ON signal to the modem when a current is present in at least one of the first and second power conductors. The connector detect module is caused to transmit a GEN_PRESENT signal to the modem when a current flows through the first cable connector, the generator connector, the jumper, the generator connector, and the first cable connector.

The present invention may also be embodied as a cable assembly adapted to be connected to a generator, a UPS system, and a modem. In this case, the connector system comprises a generator connector, a UPS connector, a modem connector, and a status monitoring cable system. The generator connector comprises a first generator contact, a second generator contact, a third generator contact, and a fourth generator contact. The first and second generator contacts are operatively connected to the generator. The UPS connector comprises a first UPS contact and a second UPS contact. The first and second UPS contacts are operatively connected to the UPS system. The modem connector comprises a first modem contact and a second modem contact. The first and second modem contacts are operatively connected to the modem. The status monitoring cable system comprises first, second, and third cable connectors, a jumper, first and second power conductors, and a sensor module. The first cable connector comprises a first cable connector first contact, a first cable connector second contact, a first cable connector third contact, and a first cable connector fourth contact. The second cable connector comprises a second cable connector first contact and a second cable connector second contact. The third cable connector comprises a modem connector first contact and a modem connector second contact. The first power conductor is connected between the first cable connector first contact and the second cable connector first contact. The second power conductor is connected between the first cable connector second contact and the second cable connector second contact. The sensor module comprises a current detect module and a connector detect module. The current detect module is coupled to at least one of the first and second power conductors and operatively connected to the modem connector first contact. The connector detect module is operatively connected to the first cable connector third contact, the first cable connector fourth contact, and the modem connector second contact. The jumper is connected between the third and fourth generator contacts. The current detect module transmits a GEN_ON signal to the modem when a current is present in at least one of the first and second power conductors. The connector detect module transmits a GEN_PRESENT signal to the modem when a current flows through the first cable connector third contact, the third generator contact, the jumper, the fourth generator contact, and the first cable connector fourth contact.

DESCRIPTION OF THE DRAWING

FIG. 7A is a perspective view of the first example first cable connector used with the first example generator;

FIG. 7B is a perspective view of an example signal module that may be used by the example connectors of the first example generator;

FIG. 8A is a front elevation view of the first example first cable connector used with the first example generator;

FIG. 8B is a front elevation view of an example generator connector of the first example generator;

FIG. 9 is a section view of the first example first cable connector and the example generator connector of the first example generator;

FIG. 10 is a section view of the first example first cable connector engaging the example generator connector of the first example generator;

FIG. 12 is a front elevation view of a second example first cable connector that may be used with a second example generator;

FIG. 13 is a side elevation view of the second example first cable connector and an example generator connector of the second example generator; and FIG. 14 is a side elevation view of the second example first cable connector engaging the example generator connector of the second example generator.

DETAILED DESCRIPTION

Figure 1:
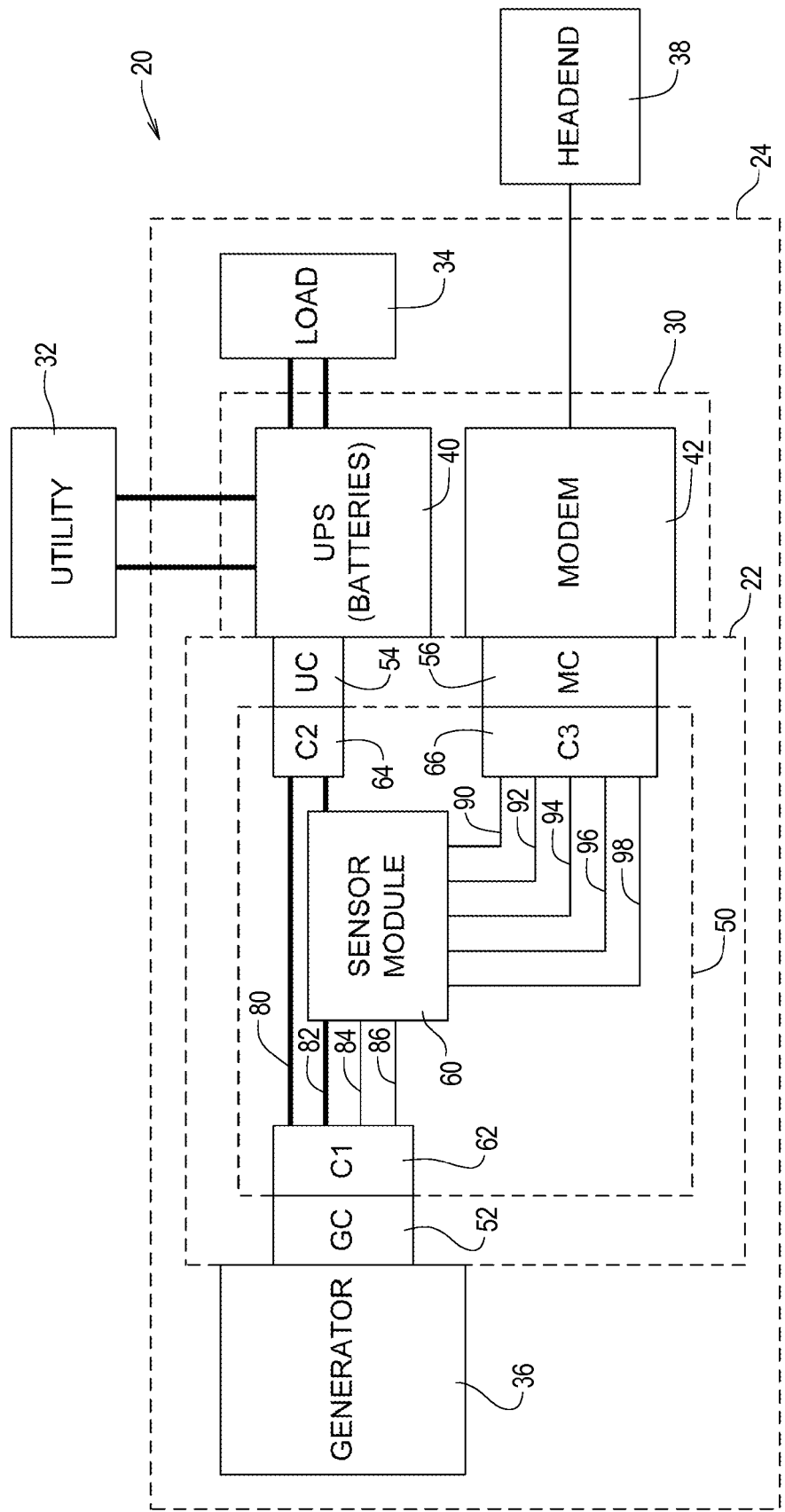
FIG. 1 is a block diagram of a communications system including a status monitoring cable of the present invention.

Referring initially to FIG. 1 of the drawing, depicted therein is an example communications system 20 comprising a first example connector system 22 constructed in accordance with, and embodying, the principles of the present invention. At least a portion of the communications system 20 is located at a local facility 24 as will be discussed in further detail below.

In addition to the first example connector system 22, the example communications system 20 comprises a power supply unit 30 configured to transfer power from a utility power source 32 to a load 34. The example communications system 20 further comprises a generator 36, and the example power supply unit 30 is also configured to transfer power from the generator 36 to the load 34. In addition, the power supply unit 30 is also operatively connected to a head end 38 to allow data communication between the power supply unit 30 and the head end 38. The example power supply unit 30 comprises an uninterruptible power supply (UPS) system 40 and modem 42. The example UPS system 40 comprises internal batteries (not shown) that provide standby power to the load 34 when utility power from the utility 32 is unavailable or not within acceptable parameters defined by the load 34.

The load 34, generator 36, head end 38, UPS system 40, and modem 42 all are or may be conventional components of a communications system such as conventional telephony (landline) networks, cellular telephone networks, and/or cable networks and will not be described herein beyond what is necessary for a complete understanding of the principles of the present invention.

The first example connector system 22, the example power supply unit 30, the load 34, and the generator 36 are all typically arranged in relatively close proximity at the local facility 24. The example utility power source 32 is connected to the power supply unit 30 but typically comprises power generation, regulation, and distribution components remotely located from the local facility 24. The head end 38 is also typically, but not necessarily, located at a location remote from the local facility 24.

In addition, data is transmitted between the power supply unit 30 and the head end 38 using any available communications system such as conventional telephony (land line) systems, cellular telecommunications systems, and/or cable communications systems. The modem 42 is provided and configured as necessary to collect, store, and format data collected at the power supply unit 30 and transmit this data to the head end 38 using one or more of the available communications systems.

Figure 2:
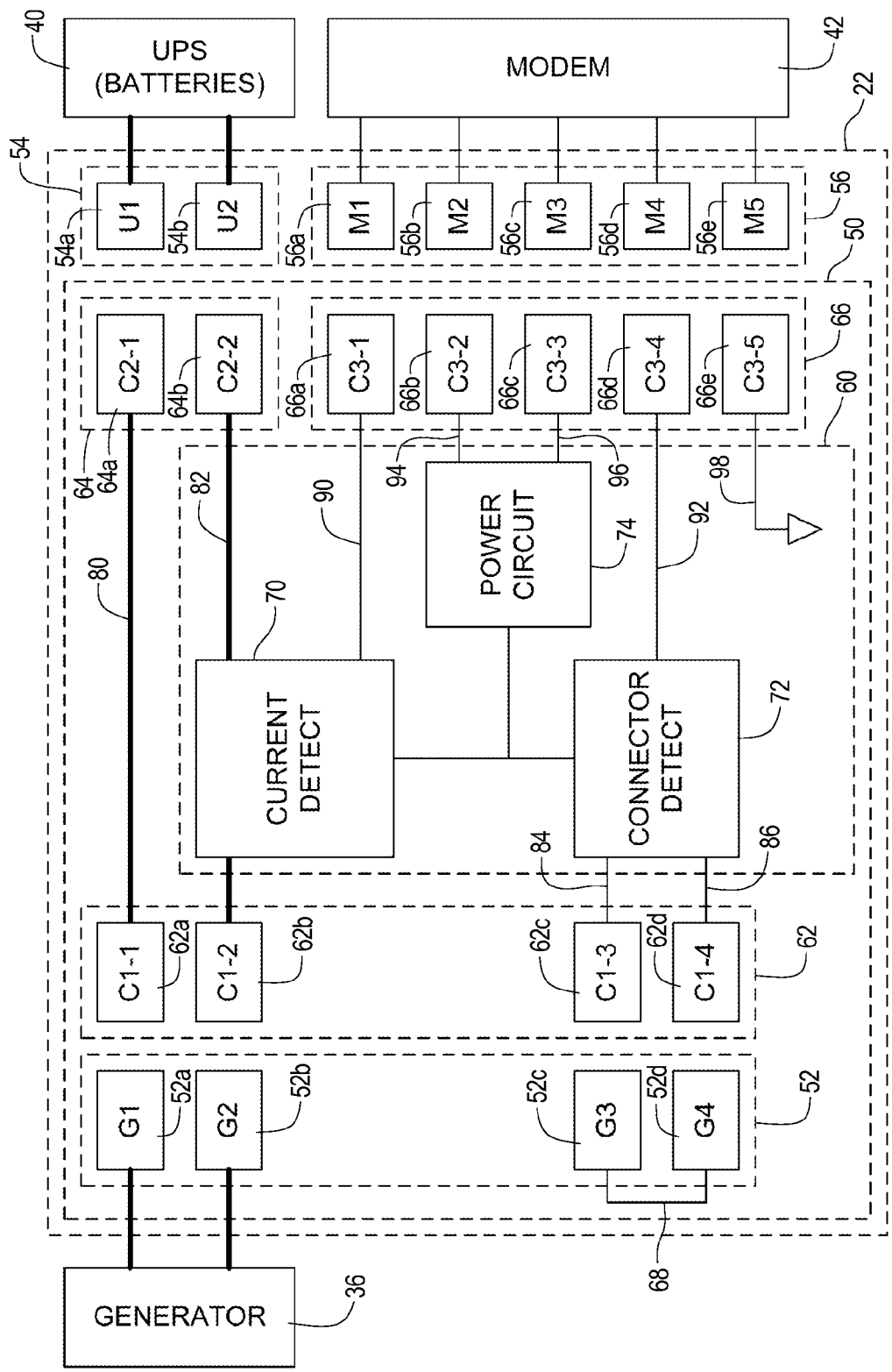
FIG. 2 is a block diagram illustrating the example status monitoring cable of FIG. 1 in more detail.

Referring now to FIGS. 1 and 2, it can be seen that the first example connector system 22 comprises a status monitoring cable system 50, a generator connector 52, a UPS connector 54, and a modem connector 56. The example status monitoring cable system 50 comprises a sensor module 60, a first cable connector 62, a second cable connector 64, a third cable connector 66, and a jumper 68 (FIG. 2).

Turning now more specifically to FIG. 2 of the drawing, the details of the first example connector system 22 are depicted in further detail. FIG. 2 illustrates that the sensor module 60 comprises a current detect module 70, a connector detect module 72, and a power circuit 74. The first example connector system 22 further comprises a first power conductor 80 and a second power conductor 82 that extends between the first cable connector 62 and the second cable connector 64. A first sensor conductor 84 and a second sensor conductor 86 extend between the sensor module 60 and the first cable connector 62. A generator status conductor 90, a generator present conductor 92, a supply conductor 94, a common conductor 96, and a chassis ground conductor 98 extend between the sensor module 60 and the third cable connector 66.

The example sensor module 60 monitors two characteristics or parameters associated with the example generator 36.

The example sensor module 60 monitors both of these characteristics or parameters even if the generator 36 is not running, and the example sensor module 60 is not configured for any particular generator design and can in fact monitor these characteristics or parameters for generators of unknown make and manufacturer.

In particular, the example current detect module 70 generates a GEN_ON signal indicative of whether the generator 36 is operating by comparing signal representative of a current through the second power conductor 82 with a reference value. The example current detect module 70 generates a signal representative of the current through the second power conductor 82 non-invasively and without making a direct electrical connection with either the first or the second power conductor 82.

The connector detect module 70 generates a GEN_PRESENT signal indicative of whether the first cable connector 62 is connected to the generator connector 52. The first cable connector 62 is configured simply to detect the presence of a short circuit at the generator 36 and, if that short circuit is missing, determines that the first cable connector 62 is not connected to the generator connector 52. The short circuit can be established by modifying the generator connector 52 such that the first and second sensor conductors 84 and 86 are effectively connected together when the first cable connector 62 is connected to the generator connector 52. Alternatively, the short circuit may be established by bringing the first and second sensor conductors 84 and 86 into contact with a conductive portion of a given generator or a conductive member attached to that generator.

The details of construction and operation of the first example connector system 22 will now be described in further detail with reference to FIGS. 2-10. FIG. 2 shows that each of the example connectors 52, 54, 56, 62, 64, and 66 defines a plurality of contacts. The following Table A defines the contacts defined by the connectors 52, 54, 56, 62, 64, and 66 forming a part of the first example cable system 22:

TABLE A

| Element Name | Reference Character | Diagram Label |
|---|---|---|
| GENERATOR CONNECTOR | 52 | GC |
| first generator contact | 52a | G1 |
| second generator contact | 52b | G2 |
| third generator contact | 52c | G3 |
| fourth generator contact | 52d | G4 |
| UPS CONNECTOR | 54 | UC |
| first UPS contact | 54a | U1 |
| second UPS contact | 54b | U2 |
| MODEM CONNECTOR | 56 | MC |
| first modem contact | 56a | M1 |
| second modem contact | 56b | M2 |
| third modem contact | 56c | M3 |
| fourth modem contact | 56d | M4 |
| fifth modem contact | 56e | M5 |
| FIRST CABLE CONNECTOR | 62 | C1 |
| first cable connector first contact | 62a | C1-1 |
| first cable connector second contact | 62b | C1-2 |
| first cable connector third contact | 62c | C1-3 |
| first cable connector fourth contact | 62d | C1-4 |
| SECOND CABLE CONNECTOR | 64 | C2 |
| second cable connector first contact | 64a | C2-1 |
| second cable connector second contact | 64b | C2-2 |
| THIRD CABLE CONNECTOR | 66 | C3 |
| third cable connector first contact | 66a | C3-1 |
| third cable connector second contact | 66b | C3-2 |
| third cable connector third contact | 66c | C3-3 |
| third cable connector fourth contact | 66d | C3-4 |
| third cable connector fifth contact | 66e | C3-5 |

The first cable connector 62 is engages the generator connector 52 such that the generator connector contacts 52a, 52b, 52c, and 52d engage or contact the first cable connector contacts 62a, 62b, 62c, and 62d, respectively, to form a low resistance electrical connection at each contact point. The second cable connector 64 engages the UPS connector 54 such that the generator connector contacts 54a and 54b engage or contact the second connector contacts 64a and 64b, respectively, to form a low resistance electrical connection at each contact point. The third cable connector 66 engages the modem connector 56 such that the modem connector contacts 56a, 56b, 56c, 56d, and 56e engage or contact the third connector contacts 66a, 66b, 66c, 66d, and 66e, respectively, to form a low resistance electrical connection at each contact point. Finally, the jumper 68 engages the third and fourth generator contacts 52c and 52d to form a short circuit between these contacts 52c and 52d.

Figure 3:
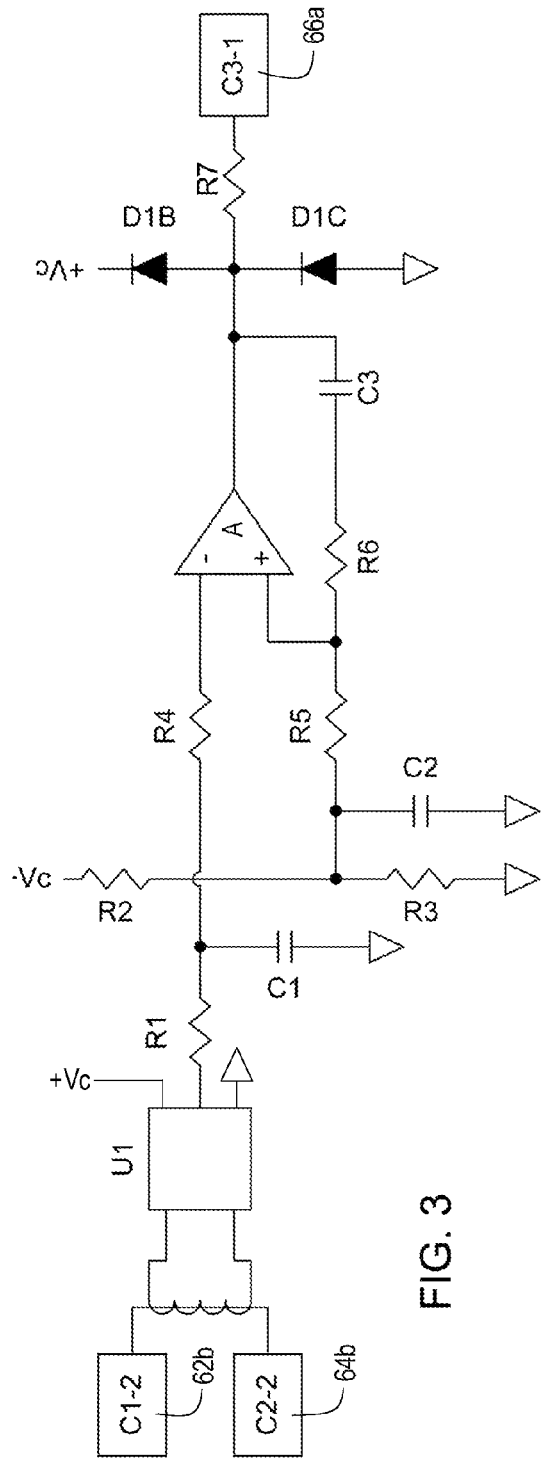
FIG. 3 is a schematic diagram of an example current detect module of the example status monitoring cable.
Figure 4:
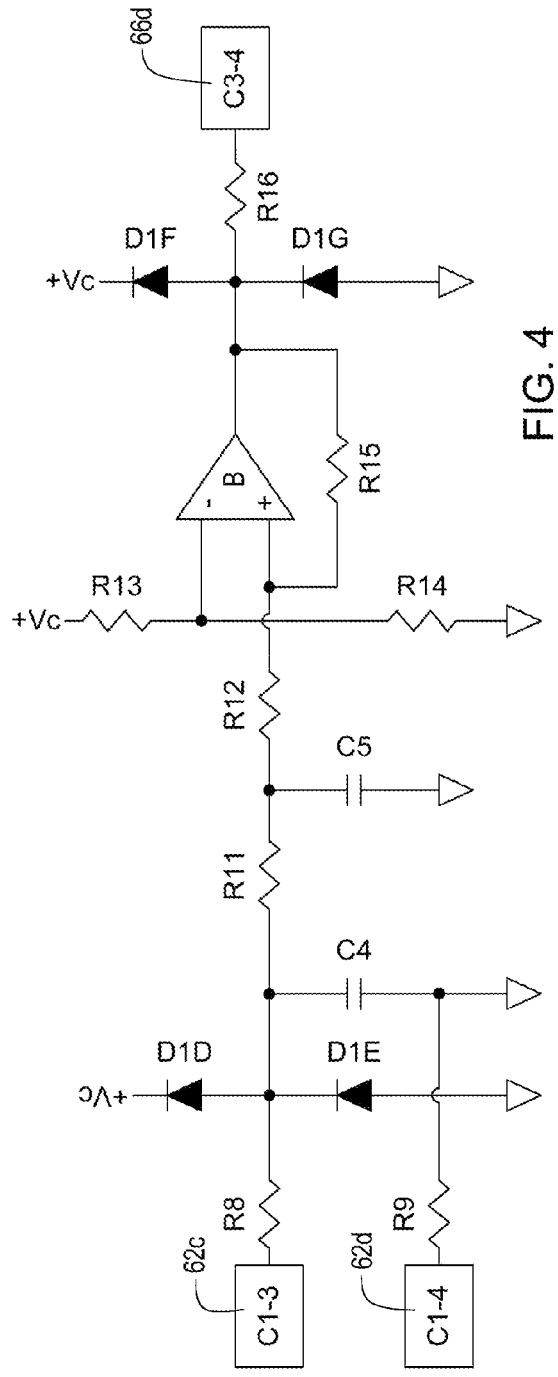
FIG. 4 is a schematic diagram of an example connector detect module of the example status monitoring cable.
Figure 5:
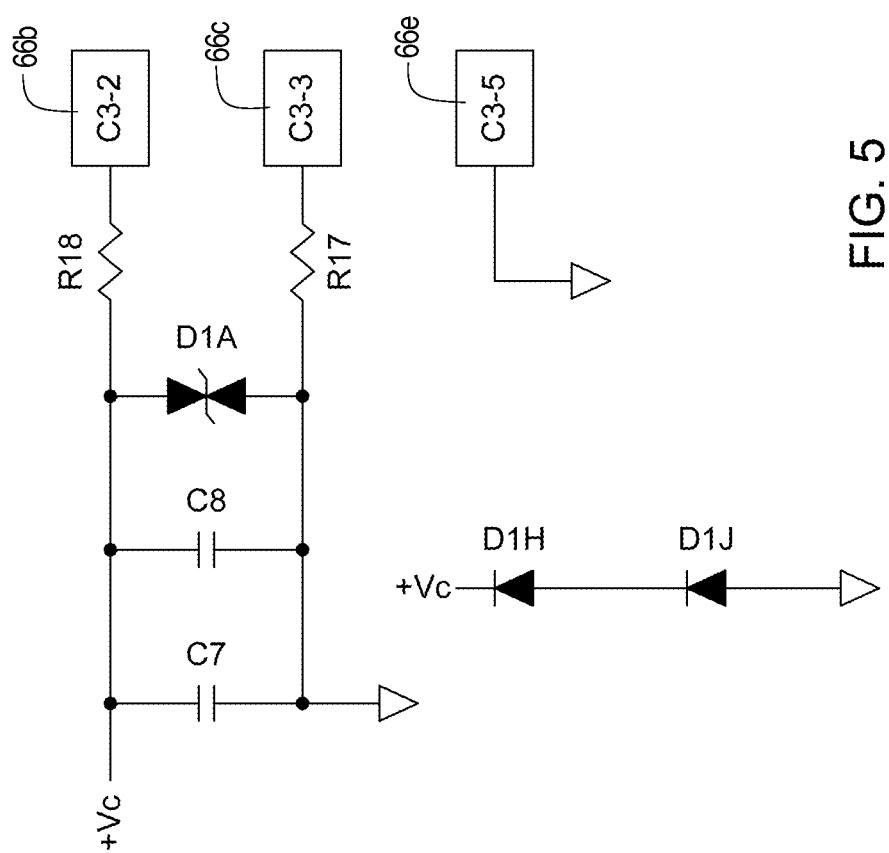
FIG. 5 is a schematic diagram of an example power circuit of the example status monitoring cable.

Turning now to FIGS. 3-5, FIG. 3 depicts an example of a circuit that may be used to form the current detect module 70, FIG. 4 depicts an example of a circuit that may be used to form the connector detect module 72, and FIG. 5 depicts an example of a circuit that may be used to form the power circuit 74.

The following components of these circuits 70, 72, and 74 are provided for protection. A small profile integrated circuit referred to as D1 provides clamp diode connection from three channels to the +supply and circuit common, along with a high current, low clamping voltage transient voltage suppression (TVS) diode D1A connected across the +supply and circuit common. Resistors R7, R8, R9, R16, R17, and R18 provide current limiting for the TVS diode D1A in the event of transient voltage events on those lines. Resistors R8 and R9 are surge rated resistors. Resistor R9 provides high resistance isolation to circuit common from the sense cable for the status monitor and modem circuitry. Circuit common of the status monitor circuitry is connected to chassis to provide a low impedance return for line currents, voltage transient currents (i.e., lightning), and radio frequency currents. Resistor R17 provides ground return isolation to the modem, and, with the chassis connection described above, forms a divider to provide a high attenuation path back to the modem along the circuit common. Resistor R17 is surge rated. Capacitor C3, along with resistors R8 and R9, form a low pass filter at radio frequencies, forcing energy in the sense cable to be common ode with respect to the status monitor circuitry and modem circuitry.

The following components are involved with the current sensing. Component U1 is an open loop Hall effect bi-directional current sensor comprising a core large enough to accommodate the second power conductor 82, internal core offset and circuit nulling and signal processing circuitry, and a current sense, voltage out transfer function. Resistor R1 and capacitor C1 form a low pass filter to provide high attenuation to line frequency components not filtered by the Hall sensor. Resistor R4 provides current limiting into the operational amplifier A input from capacitor C1 during power supply transitions. Resistors R2 and R3 set the center of the operating range for the Hall sensor and track a factor of the transfer function of the Hall sensor closely for a low range of measured currents (0 to 3 A). Resistors R5 and R6 and capacitor C2 provide dynamic hysteresis. Resistor R7 provides isolation between the cable to the modem and the operational amplifier A. The output of the current detect module 70 is LO if the sensed current is greater than 3 A, HI if the sensed current is less than 0.5 A, and undefined between 0.5 and 3 A.

The following components are involved in connector sensing. Resistors R8, R9, and R10 set the sense current to approximate 2 mA. Capacitor C4 and resistors R8 and R9 form a low pass filter for RF, and resistor R11 and capacitor C5 perform the same function at line frequencies. Resistor R12 provides current limiting from capacitor C4 into the input of operational amplifier B during power transitions. Resistors R13 and R14 set the switching threshold, and resistors R11, R12, and R15 provide short and long term hysteresis. Resistor R16 provides isolation between the cable to the modem and the operations amplifier A. The output of the connector detect module 72 is LO if current flows through the first and second sensor conductors 84 and 86 (the jumper 68 is present) and HI if no current flows through the first and second sensor conductors 84 and 86.

Figure 6:
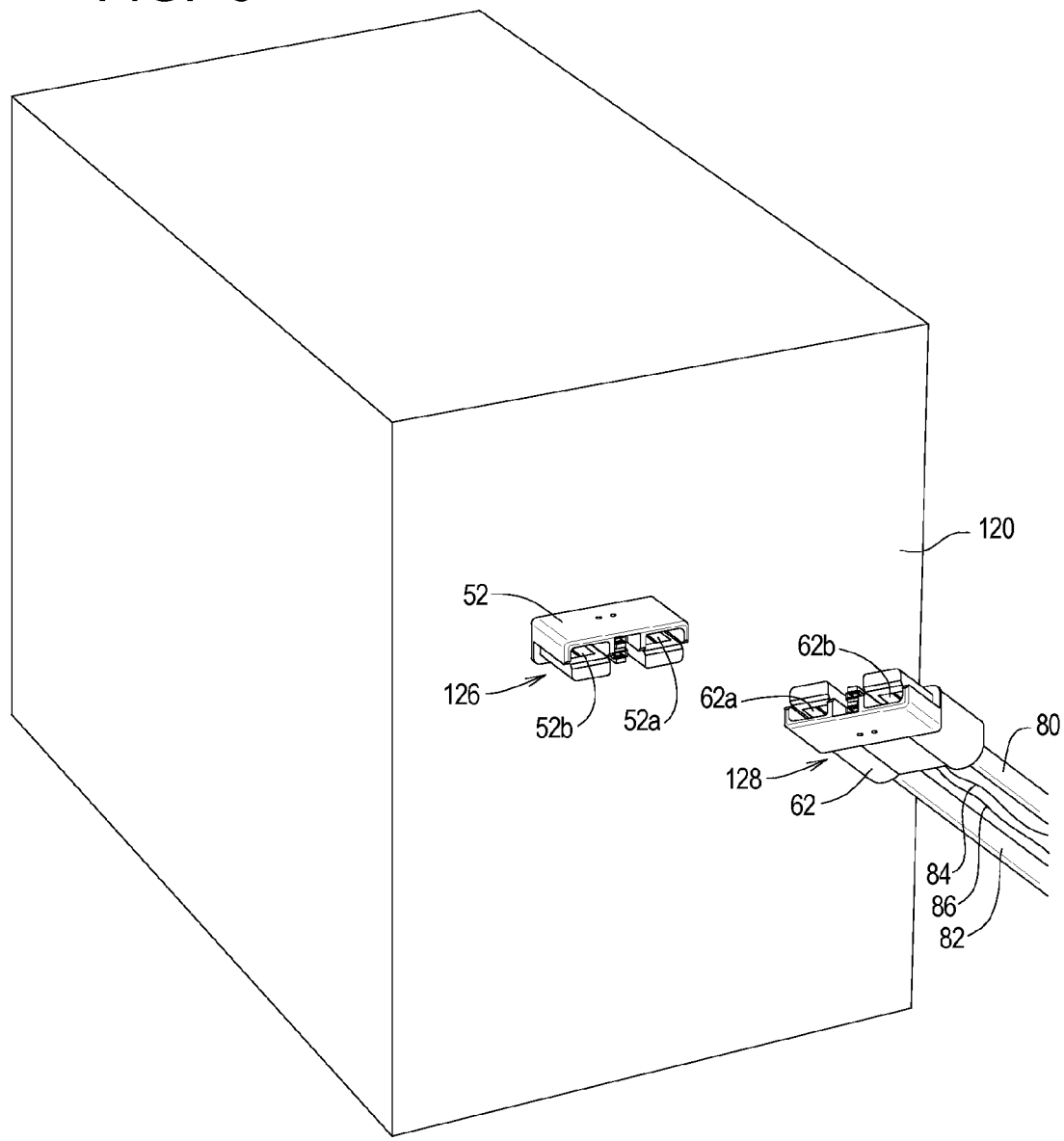
FIG. 6 is a perspective view of a first example generator and an example first cable connector of an example status monitoring system of the present invention.
Figure 11:
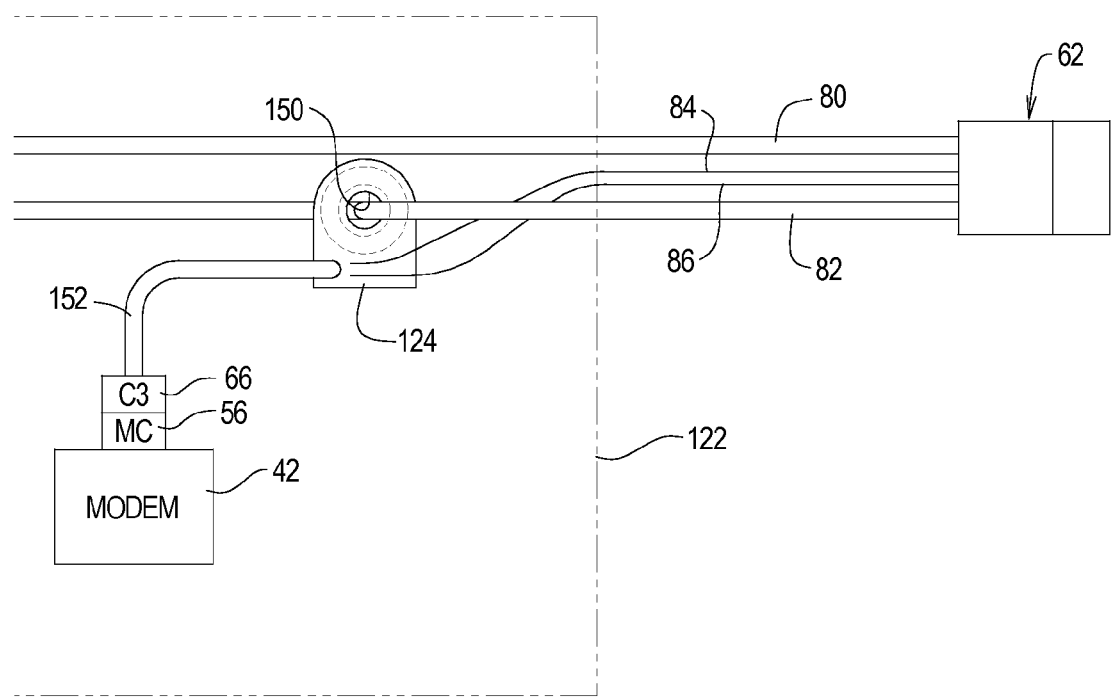
FIG. 11 is a somewhat schematic view depicting the engagement of a sensor housing with a second power cable of the example status monitoring cable system.

Turning now to FIGS. 6-10 of the drawing, a first example of the mechanical structure of the first example connecter system 22 will now be described in further detail. The generator 36 comprises a generator enclosure 120 (FIG. 6). The power supply unit 30 defines a power supply enclosure 122, while the sensor module 60 defines a sensor housing 124 (FIG. 11).

The generator connector 52 comprises a generator connector housing 126, and the first cable connector 62 defines a first cable connector housing 128 (FIGS. 6 and 7-10). The generator connector housing 126 is supported by the generator enclosure 120, and the first cable connector housing 128 is supported by ends of the first and second power conductors 80 and 82 and the first and second sensor conductors 84 and 86. It should be noted that the example generator connector 52 and the example first cable connector 62 are identical and further constructed such that they can be detachably attached from each other in a reversed configuration. Other connector styles may be used in place of the example connectors 52 and 62.

The generator connector 52 further comprises first and second generator signal modules 130 and 132. The generator connector housing 126 defines first and second generator signal sockets 134 and 136 that are adapted to detachably attach the first and second generator signal modules 130 and 132 to the connector housing 126. The first cable connector 62 further comprises first and second cable signal modules 140 and 142. The first cable connector housing 128 defines first and second generator signal sockets 144 and 146 that are adapted to detachably attach the first and second generator signal modules 130 and 132 to the connector housing 126.

The first and second generator contacts 52a and 52b are supported by the generator connector 52 and electrically connected to the generator 36 such that the output of the generator 36 is present across these contacts 52a and 52b. As shown in FIGS. 8B, 9, and 10, the third and fourth generator contacts 52c and 52d are supported by the first and second generator signal modules 130 and 132. Further, the jumper 68 is supported by the first and second generator signal modules 130 and 132 to form a conductive path between the third and fourth generator contacts 52c and 52d.

The first cable connector first and second contacts 62a and 62b are supported by the first cable connector 62 and electrically connected to the first and second power conductors 80 and 82. When the first cable connector 62 is detachably attached to the generator connector 52, the first cable connector first and second contacts 62a and 62b come into contact with the first and second generator contacts 52a and 52b such that the output of the generator 36 is present across the second cable connector first and second contacts 64a and 64b. And as shown in FIGS. 8A, 9, and 10, the first cable connector third and fourth contacts 62c and 62d are supported by the first and second cable signal modules 140 and 142. When the first cable connector 62 is detachably attached to the generator connector 52, the first cable connector third and fourth contacts 62c and 62d come into contact with the third and fourth generator contacts 52c and 52d such current can flow between the first and second sensor conductors 84 and 86 through the jumper 68.

FIG. 11 of the drawing shows the physical location of the sensor module 60. In particular, the sensor housing 124 defines an opening 150 and is located within the power supply enclosure 122. Within the sensor housing 124, the Hall sensor is arranged such that the winding thereof is coiled around the opening 150. The second power conductor 82 is extended through opening 150 such that the Hall sensor generates an output signal when current flows through the second power conductor 82.

FIG. 11 further shows a cable bundle 152 comprising the generator status conductor 90, generator present conductor 92, supply conductor 94, common conductor 96, and chassis ground conductor 98 (FIG. 2). The cable bundle 152 electrically connects the sensor module 60 to the modem 42 through the third cable connector 66 and modem connector 56 as shown in FIG. 11.

Turning now to FIGS. 12-14 of the drawing, a second example of the mechanical structure of the example connecter system 22 will now be described in further detail. In this second example mechanical structure, the generator 36 comprises a generator enclosure 220 (FIGS. 13 and 14). A generator connector 222 is supported by the generator enclosure 220. A first cable connector 224 is supported by the ends of the first and second power conductors 80 and 82. The example generator connector 222 and example first cable connector 224 are conventional grounded three-prong sockets (generator connector 222) and plugs (first cable connector 224). In particular, first, second, and third contacts 222a, 222b, and 222c of the generator connector 222 are sized and dimensioned to receive first, second, and third prongs 224a, 224b, and 224c, respectively, of the first cable connector 224.

Mounted on the first cable connector 224 is a cable signal module 226 that is operatively connected to the first and second sensor conductors 84 and 86. In particular, the cable signal module 226 comprises first and second contacts or terminals 226a and 226b that are connected to the first and second sensor conductors 84 and 86.

If the generator enclosure 220 defines a conductive surface, the cable signal module 226 may be positioned such that the contacts or terminals 226a and 226b engage this conductive surface when the generator connector 222 is properly engaged with the first cable connector 224 to allow current to flow from the generator to the second cable connector (not shown in FIGS. 12-14). When properly engaged, current will flow from one of the contacts or terminals 226a, through the conductive surface, and then to the other of the contacts or terminals 226b. The connector detect module 72 will thus determine that the connectors 222 and 224 are properly connected as generally described above. If the generator enclosure 220 is made of painted metal, a small portion of the paint can be removed to create a conductive surface.

If the generator enclosure 220 does not or can or should not be altered to define a conductive surface, a jumper plate 230 made of conductive material may be applied to the generator enclosure. In this case, the cable signal module 226 is positioned such that the contacts or terminals 226a and 226b engage this jumper plate 230 when the generator connector 222 is properly engaged with the first cable connector 224. When properly engaged, current will flow from one of the contacts or terminals 226a, through the jumper plate 230, and then to the other of the contacts or terminals 226b. The connector detect module 72 will thus determine that the connectors 222 and 224 are properly connected as generally described above.

As another alternative, the contact or terminals 226*a* and 226*b* can be arranged within the cable signal module 226, and a conductive member within the cable signal module 226 may be displaced using magnetic force to complete the circuit between the terminals 226*a* and 226*b*. In this case, a strong magnet may be located on or within the generator enclosure 220 adjacent to the generator connector 222 to cause the conductive member within the cable signal module 226 to engage the two terminals 226*a* and 226*b* when the generator connector 222 properly receives the first cable connector 224.

As yet another alternative, a magnetic sensor may be formed between the two terminals 226*a* and 226*b* and a magnet secured relative to the generator enclosure 220 in place of the jumper plate.

What is claimed is:

1. A connector system adapted to be connected to a generator, a UPS system, and a modem, the connector system comprising:
    a generator connector operatively connected to the generator;
    a UPS connector operatively connected to the UPS system;
    a modem connector operatively connected to the modem; and
    a status monitoring cable system comprising
        a first cable connector adapted to be connected to the generator connector;
        a second cable connector adapted to be connected to the UPS connector;
        a third cable connector adapted to be connected to the modem connector,
        a jumper,
        first and second power conductors connected between the first cable connector and the second cable connector, and
        a sensor module comprising
            a current detect module
                coupled to at least one of the first and second power conductors, and
                operatively connected to the third cable connector, and
            a connector detect module operatively connected to
                the first cable connector, and
                the third cable connector; wherein
    the jumper is supported relative to the generator connector;
    the current detect module transmits a GEN_ON signal to the modem when a current is present in at least one of the first and second power conductors; and
    the connector detect module transmits a GEN_PRESENT signal to the modem when a current flows through the first cable connector, the generator connector, the jumper, the generator connector, and the first cable connector.

2. A connector system as recited in claim 1, in which the sensor module further comprises a power supply module operatively connected to the third cable connector, the current detect module, and the connector detect module, where the power supply module:
    obtains power from the modem; and
    provides power to the current detect module and the connector detect module.

3. A connector system as recited in claim 1, in which the current detect module comprises a current sensor operatively connected to one of the first and second power conductors.

4. A connector system as recited in claim 1, further comprising:
    first and second status conductors operatively connected between the first cable connector and the sensor module; wherein
    the current detect module and the connector detect module are located adjacent to a generator enclosure containing the UPS system; and
    the first and second power conductors and the first and second status conductors form a cable bundle that extends between the generator enclosure and the first cable connector.

5. A connector system as recited in claim 1, in which:
    the generator connector comprises a generator connector housing; and
    the jumper is located within the generator connector housing.

6. A connector system as recited in claim 1, in which:
    the generator comprises a generator enclosure; and
    the jumper is attached to the generator enclosure.

7. A connector system as recited in claim 1, in which:
    the generator comprises a generator enclosure; and
    the jumper formed by a conductive surface on the generator enclosure.

8. A method of connecting a generator, a UPS system, and a modem, the method comprising the steps of:
    operatively connecting a generator connector to the generator;
    operatively connecting a UPS connector to the UPS system;
    operatively connecting a modem connector to the modem; and
    providing a first cable connector adapted to be connected to the generator connector;
    providing a second cable connector adapted to be connected to the UPS connector;
    providing a third cable connector adapted to be connected to the modem connector,
    connecting first and second power conductors connected between the first cable connector and the second cable connector, and
    coupling a current detect module to at least one of the first and second power conductors;
    operatively connecting the current detect module to the third cable connector;
    operatively connecting a connector detect module to the first cable connector and the third cable connector;
    supporting a jumper relative to the generator connector;
    causing the current detect module to transmit a GEN_ON signal to the modem when a current is present in at least one of the first and second power conductors; and
    causing the connector detect module to transmit a GEN_PRESENT signal to the modem when a current flows through the first cable connector, the generator connector, the jumper, the generator connector, and the first cable connector.

9. A method as recited in claim 8, further comprising the steps of:
    operatively connecting a power supply module to the third cable connector, the current detect module, and the connector detect module; and
    operating the power supply module to obtain power from the modem and provide to the current detect module and the connector detect module.

10. A method as recited in claim 8, further comprising the step of forming the current detect module by operatively connecting a current sensor to one of the first and second power conductors.

11. A method as recited in claim 8, further comprising the steps of:
  operatively connecting first and second status conductors between the first cable connector and the sensor module;
  locating the current detect module and the connector detect module adjacent to a generator enclosure containing the UPS system; and
  forming a cable bundle comprising the first and second power conductors and the first and second status conductors, where the cable bundle extends between the generator enclosure and the first cable connector.

12. A method as recited in claim 8, in which:
  the step of providing the generator connector comprises the step of providing a generator connector housing; and
  the step of supporting the jumper relative to the generator connector comprises the step of locating the jumper within the generator connector housing.

13. A method as recited in claim 8, in which:
  the step of providing the generator comprises the step of providing a generator enclosure; and
  the step of supporting the jumper relative to the generator connector comprises the step of attaching the jumper to the generator connector housing.

14. A method as recited in claim 8, in which:
  the step of providing the generator comprises the step of providing a generator enclosure; and
  the step of supporting the jumper relative to the generator connector comprises the step of forming a conductive surface on the generator enclosure.

15. A cable assembly adapted to be connected to a generator, a UPS system, and a modem, the connector system comprising:
  a generator connector comprising
    a first generator contact,
    a second generator contact,
    a third generator contact, and
    a fourth generator contact, where
      the first and second generator contacts are operatively connected to the generator;
  a UPS connector comprising
    a first UPS contact, and
    a second UPS contact, where
      the first and second UPS contacts are operatively connected to the UPS system;
  a modem connector comprising
    a first modem contact, and
    a second modem contact, where
      the first and second modem contacts are operatively connected to the modem; and
  a status monitoring cable system comprising
    a first cable connector comprising
      a first cable connector first contact,
      a first cable connector second contact,
      a first cable connector third contact, and
      a first cable connector fourth contact,
    a second cable connector comprising
      a second cable connector first contact, and
      a second cable connector second contact,
    a third cable connector comprising
      a modem connector first contact, and
      a modem connector second contact,
    a jumper,
    a first power conductor connected between the first cable connector first contact and the second cable connector first contact,
    a second power conductor connected between the first cable connector second contact and the second cable connector second contact, and
    a sensor module comprising
      a current detect module
        coupled to at least one of the first and second power conductors, and
        operatively connected to the modem connector first contact, and
      a connector detect module operatively connected to
        the first cable connector third contact,
        the first cable connector fourth contact, and
        the modem connector second contact; wherein
  the jumper is connected between the third and fourth generator contacts,
  the current detect module transmits a GEN_ON signal to the modem when a current is present in at least one of the first and second power conductors; and
  the connector detect module transmits a GEN_PRESENT signal to the modem when a current flows through the first cable connector third contact, the third generator contact, the jumper, the fourth generator contact, and the first cable connector fourth contact.

16. A connector system as recited in claim 15, in which the sensor module further comprises a power supply module operatively connected to the third cable connector, the current detect module, and the connector detect module, where the power supply module:
  obtains power from the modem; and
  provides power to the current detect module and the connector detect module.

17. A connector system as recited in claim 15, in which the current detect module comprises a current sensor operatively connected to one of the first and second power conductors.

18. A connector system as recited in claim 15, further comprising:
  first and second status conductors operatively connected between the first cable connector and the sensor module; wherein
  the current detect module and the connector detect module are located adjacent to a generator enclosure containing the UPS system; and
  the first and second power conductors and the first and second status conductors form a cable bundle that extends between the generator enclosure and the first cable connector.

19. A connector system as recited in claim 15, in which:
  the generator connector comprises a generator connector housing; and
  the jumper is located within the generator connector housing.

20. A connector system as recited in claim 15, in which:
  the generator comprises a generator enclosure; and
  the jumper is attached to the generator enclosure.

21. A connector system as recited in claim 15, in which:
  the generator comprises a generator enclosure; and
  the jumper formed by a conductive surface on the generator enclosure.

* * * * *